(12) United States Patent
Kasim et al.

(10) Patent No.: US 6,358,288 B1
(45) Date of Patent: Mar. 19, 2002

(54) TOUCHLESS STABILIZER FOR PROCESSING SPHERICAL DEVICES

(75) Inventors: Ramesh K. Kasim, Garland; Ram Ramamurthi, Allen, both of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/418,157

(22) Filed: Oct. 13, 1999

Related U.S. Application Data

(62) Division of application No. 09/066,222, filed on Apr. 24, 1998, now Pat. No. 6,168,638.

(51) Int. Cl.$^7$ .................. H01L 21/00; H01L 21/64; C30B 28/08; B05C 11/00; B05C 13/00
(52) U.S. Cl. .................. 29/25.01; 118/62; 117/901
(58) Field of Search .................. 29/25.01; 118/62; 117/901

(56) References Cited

U.S. PATENT DOCUMENTS

| | | | |
|---|---|---|---|
| 998,762 A | * 7/1911 | Faller | |
| 2,310,265 A | * 2/1943 | Sweeney | |
| 2,812,061 A | * 11/1957 | Pfister | |
| 3,219,380 A | * 11/1965 | Carliss | |
| 4,071,272 A | * 1/1978 | Drdlik | |
| 4,302,311 A | * 11/1981 | Lowe et al. | |
| 4,378,209 A | 3/1983 | Berge et al. | .................. 432/58 |
| 4,425,376 A | * 1/1984 | Lee | |
| 4,735,449 A | * 4/1988 | Kuma | |
| 4,969,676 A | * 11/1990 | LaMagna | |
| 5,067,762 A | 11/1991 | Akashi | .................. 294/64.3 |
| 5,169,196 A | * 12/1992 | Safabakhsh | |
| 5,215,688 A | * 6/1993 | Williamson et al. | |
| 5,560,543 A | 10/1996 | Smith et al. | ............. 239/102.2 |
| 5,955,776 A | 9/1999 | Ishikawa | ................... 257/618 |
| 6,120,602 A | 9/2000 | Stephens et al. | ............ 117/200 |

* cited by examiner

Primary Examiner—David E. Graybill
(74) Attorney, Agent, or Firm—Haynes and Boone LLP

(57) ABSTRACT

A method for securing a device, such as a spherical shaped semiconductor integrated circuit, for fabrication. An apparatus includes a plenum having an input and several outputs. The input of the plenum is connected to a pressurized fluid source. The outputs are separated into two groups: a centralized output and several peripheral outputs. The outputs connects to apertures located on a top surface of the apparatus. The centralized apertures expel the pressurized fluid from the fluid source to suspend the spherical shaped semiconductor integrated circuit device above the top surface. The peripheral apertures expel the pressurized fluid from the fluid source to secure the device above the centralized apertures.

11 Claims, 2 Drawing Sheets

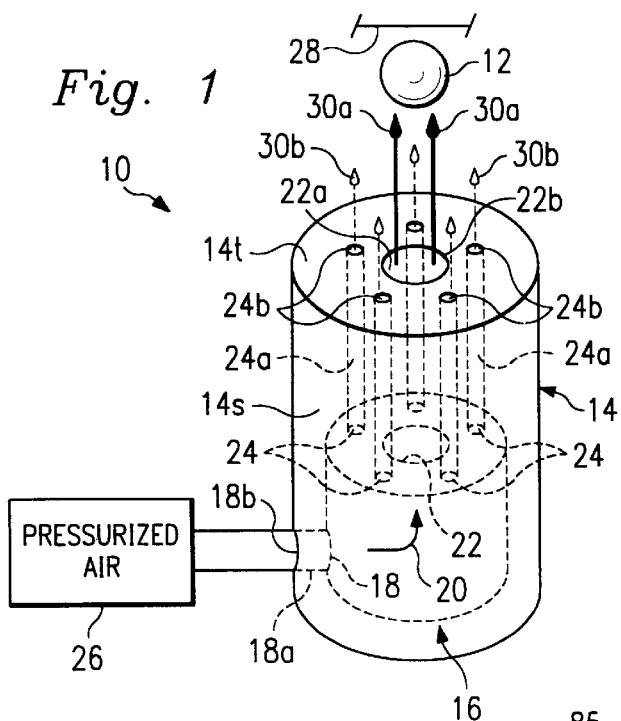
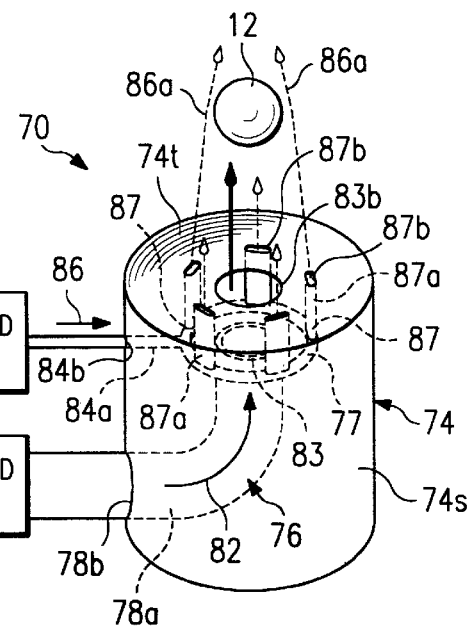
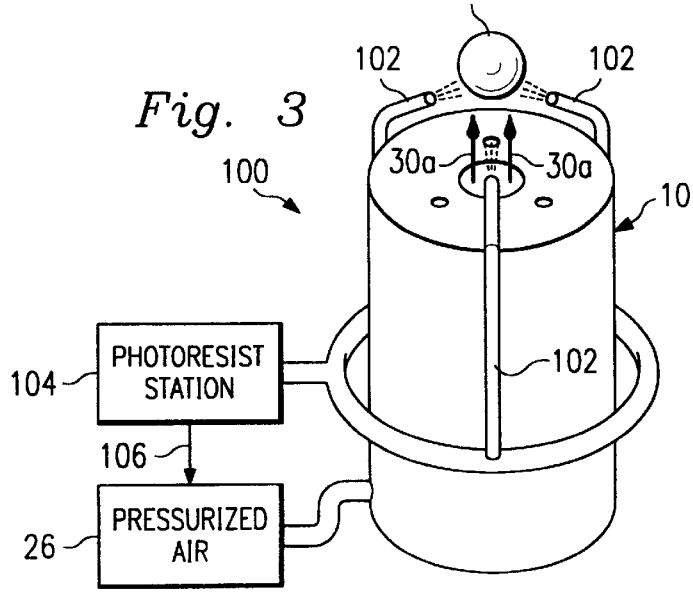

TOUCHLESS STABILIZER FOR PROCESSING SPHERICAL DEVICES

This is a divisional of U.S. Ser. No. 09/066,222 filed Apr. 24, 1998, Pat. No. 6,168,638 B1

BACKGROUND OF THE INVENTION

The invention relates generally to a nozzle device, and more particularly, to an apparatus and method for holding and securing a spherical-shaped device.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,955,776 filed on May 16, 1997, assigned to the same assignee as the present application and hereby incorporated by reference, a method and apparatus for manufacturing spherical-shaped semiconductor integrated circuits is disclosed. The present invention is specific to an apparatus and method for securing the circuits to facilitate the performance of different fabrication steps, while not specifically contacting the circuits.

SUMMARY OF THE INVENTION

The present invention, accordingly, provides an apparatus and method for securing a device, such as a spherical shaped semiconductor integrated circuit, for fabrication. To this end, the apparatus includes a plenum having an input and several outputs. The input of the plenum is connected to a pressurized fluid source. The outputs are separated into two groups: one or more centralized outputs and several peripheral outputs. The outputs connect to a plurality of apertures located on a top surface of the apparatus.

The centralized apertures expel the pressurized fluid from the fluid source to suspend the spherical shaped semiconductor integrated circuit device above the top surface. In one embodiment, the peripheral apertures expel the pressurized fluid from the fluid source at a velocity that is greater than that of the fluid from the centralized apertures. The high-velocity fluid thereby secures the device above the centralized apertures. In another embodiment, the expelled fluids from the peripheral apertures do not contact the device, unless the device were to move away from its desired position over the centralized apertures.

Several advantages result from the foregoing. For one, the spherical shaped semiconductor integrated circuit device is held securely by the expelled fluids so that it can receive processing operation thereon. Also, no physical contact is made on the device during processing. Further, the method of the present invention can be carried out in a relatively small space and helps to eliminate the requirements for large clean room facilities.

BRIEF DESCRIPTION OF THE DRAWINGS

FIG. 1 illustrates a stabilizing nozzle according to one embodiment of the invention.

FIG. 2 illustrates a stabilizing nozzle according to another embodiment of the invention.

FIG. 3 illustrates the stabilizing nozzle of FIG. 1 being used with a photoresist processing operation.

DESCRIPTION OF THE EMBODIMENTS

Figure 4:
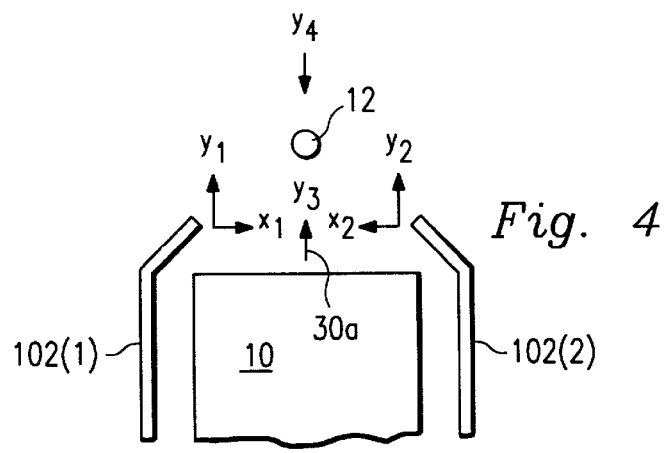
FIG. 4 is a partial, side view of the stabilizing nozzle and photoresist components of FIG. 3.

Referring to FIG. 1, the reference numeral 10 refers, in general, to one embodiment of a stabilizing nozzle for implementing features of the present invention. The stabilizing nozzle 10 not only provides a bed of air with which to float or suspend a device 12, but also provides a wall of air with which to stabilize the device. As a result, the device 12 not only is held without physical contact, but is also secured for receiving processing operations.

In the below-described embodiments, the device 12 is a spherical shaped semiconductor device as described in U.S. Pat. No. 5,955,776 Further, the processing operations to be performed on the device 12 include such processes as photoresist coating, exposure, development, and baking. However, it is understood that minor alterations to the embodiments can be made to facilitate different types of devices and/or processing operations.

The stabilizing nozzle 10 includes a cylindrical outer barrel 14 housing an air plenum 16. The air plenum 16 includes an inlet 18 for receiving a fluid 20 and a plurality of outlets 22, 24 for expelling the fluid. The inlet 18 attaches to a conduit 18a which connects the plenum 16 with an aperture 18b on a side portion 14s of the barrel 14. The aperture 18b is further connected to a source 26 for the pressurized fluid.

The outlet 22 attaches to a conduit 22a which connects the plenum 16 with an aperture 22b centered on a top portion 14t of the barrel 14. The outlets 24 attach to conduits 24a which connect the plenum 16 with apertures 24b on the top portion 14t of the barrel 14. For the sake of clarity, some of the outlets 24, conduits 24a, and apertures 24b are not labeled in FIG. 1. The apertures 24b form a ring surrounding and concentric with the aperture 22, the ring having a diameter 28 slightly larger than the diameter of the device 12. The apertures 22b, 24b are each substantially circular in shape, a diameter of the aperture 22b being slightly smaller than a diameter of the device 12. Also, the diameter of the aperture 22b is greater than a diameter of any of the apertures 24b.

Although not shown, in another embodiment, the stabilizing nozzle 10 is a monolithic device with the plenum 16 and conduits 22a, 24a formed therein. In this embodiment, the inlet 18 is located on the bottom of the air plenum 16, with reference to the alignment used in FIG. 1. Also, the conduit 18a and air source 26 are positioned below the nozzle. As a result, the nozzle 10 can be lowered on top of the conduit 18a, which provides the air connection between the source 26 and the plenum 16 and also supports the nozzle in an upright position.

Other embodiments may have the stabilizing nozzle 10 formed of separate pieces. Furthermore, it is understood that the number of apertures 22b, 24b, conduits 22a, 24a, and outlets 22, 24 are merely representative. For example, the aperture 22b may represent a collection of centrally located apertures that as a group, perform the same function as the single aperture 22b. By having a collection of apertures instead of the single aperture 22b, it is possible to perform additional functions, such as spinning the device 12.

In operation, the pressurized fluid source 26 provides the fluid 20, which flows through the conduit 18a into the plenum 16. The fluid 20 is expelled through the outlets 22, 24 and into the conduits 22a, 24a, respectively. Because the diameter of the aperture 22b is greater than that for any of apertures 24b, the velocity of an expelled fluid 30a through the aperture 22b is less than the velocity of an expelled fluid 30b through any of the apertures 24b. As a result, the expelled fluid 30a floats the device 12 above the top surface 14a, while the expelled fluids 30b serve to secure and center the device. In the present embodiment, the top portion 14t is relatively flat and the expelled fluids 30b do not come into contact with the device 12 as long as the device is properly positioned over the top surface.

Referring to FIG. 2, the reference numeral 70 refers, in general, to another embodiment of a stabilizing nozzle for implementing features of the present invention. The stabilizing nozzle 70 also provides a bed of air with which to float the device 12 and a wall of air with which to stabilize the device. The stabilizing nozzle 70 has several differences from the embodiment 10 of FIG. 1, it being understood that combinations of these differences may be used to produce many different embodiments.

The stabilizing nozzle 70 includes a cylindrical outer barrel 74 housing two air plenums 76, 77. The air plenum 76 attaches to a conduit 78a which extends through an aperture 78b on a side portion 74s of the barrel 74 and is further connected to a first source 80 for a first pressurized fluid 82. The air plenum 76 receives the first pressurized fluid 82 and expels it through an outlet 83.

The air plenum 77 attaches to a conduit 84a which extends through an aperture 84b on the side portion 74s of the barrel 74 and is further connected to a second source 85 for a second pressurized fluid 86. The air plenum 77 receives the second pressurized fluid 86 and expels it through a plurality of outlets 87. For the sake of clarity, some of the outlets 87 are not labeled in FIG. 2.

The outlet 83 attaches to a conduit which connects the plenum 76 with an aperture 83b centered on a concave-shaped top portion 74t of the barrel 74. The outlets 87 attach to conduits 87a which connect the plenum 83 with apertures 87b on the top portion 74t of the barrel 74. The aperture 83b is substantially circular in shape, while the apertures 87b are elliptical in shape. The conduits 87a project slightly inward towards the aperture 83b and the apertures 87b form a ring surrounding and concentric with the aperture 83b, the ring having a diameter larger than the diameter of the device 12.

In operation, the first pressurized fluid source 80 provides the first fluid 82, which flows through the conduit 78a into the plenum 76. The fluid 82 is then expelled through the outlet 83 and eventually through the aperture 83b. At the same time, the second pressurized fluid source 85 provides the second fluid 86, which flows through the conduit 84a into the plenum 77. The fluid 86 is then expelled through the outlets 87 and eventually through the apertures 87b.

As a result, the fluid expelled through the aperture 83b (hereinafter expelled fluid 82a) floats the device 12 above the top surface 74t, while the fluids expelled through the apertures 87b (hereinafter expelled fluids 86a) serve to secure and center the device. Furthermore, because the top portion 74t is concave and the conduits 87a are directed inward, the expelled fluids 86a form a conical-shaped wall around and above the device 12, thereby further securing the device in a centered position over the aperture 83b.

Referring to FIG. 3, the stabilizing nozzle 10 may be used in various processing operations. For example, in a photoresist operation 100, ultrasonic nozzles 102 can be used to spray a photo-resist chemical from a photoresist station 104 onto the device 12. In one embodiment, there are three ultrasonic nozzles 102, each 120 degrees apart. The stabilizing nozzle 10 secures the device 12 throughout the processing operation without physically touching the device.

Referring also to FIG. 4, a two-dimensional side view of the stabilizing nozzle 10 and two ultrasonic nozzles 102, designated nozzle 102(1) and 102(2), illustrates certain benefits of the entire system. As described in detail with reference to FIG. 1, the stabilizing nozzle 10 secures the device 12 with a fluid 30a. The fluid 30a applies a vertical force to the device 12, represented by the arrow $y_3$. A force $y_4$ represents a gravitational pull on the device 12. Both of the ultrasonic nozzles 102(1), 102(2) exert horizontal forces $x_1$, $x_2$ and vertical forces $y_1$, $y_2$, respectively. The horizontal forces $x_1$, $x_2$ are equal and opposite to each other and effectively eliminate each other.

During operation, the pressurized air source 26 operates to equalize the vertical forces $y_1$, $y_2$, $y_3$, $y_4$. In particular, when the ultrasonic nozzles 102(1), 102(2) are not in operation ($y_1$, $y_2$=0), a signal 106 (FIG. 3) notifies the pressurized air source 26 to adjust the pressure of the fluid 20 so that the expelled fluid 30a flows at a force:

$$y_3 = -1 \times y_4.$$

When the ultrasonic nozzles 102(1), 102(2) are in operation ($y_1$, $y_2 \neq 0$), the signal 106 notifies the pressurized air source 26 to adjust the pressure of the fluid 20 so that the expelled fluid 30a flows at a force:

$$y_3 = -1 \times (y_1 + y_2 + y_4).$$

Figure 5:
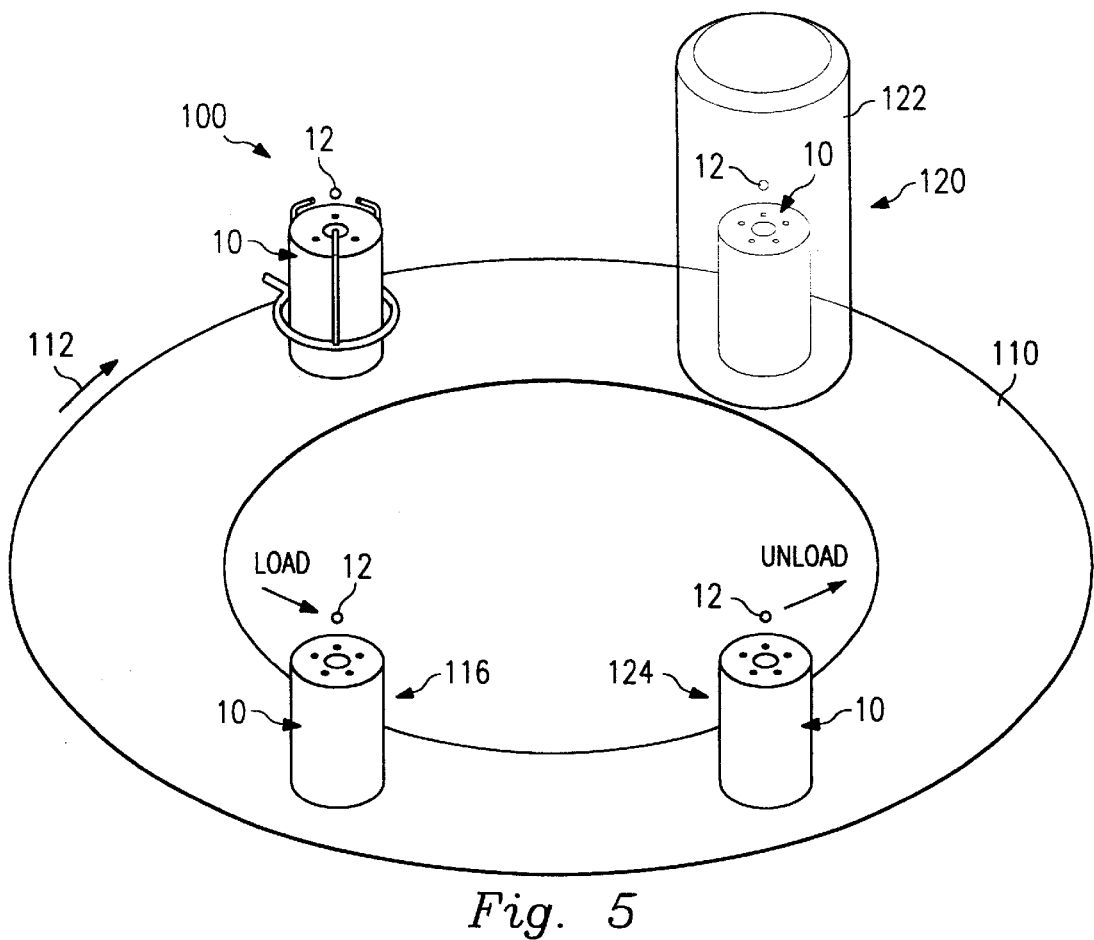
FIG. 5 illustrates a multi-operation configuration using the stabilizing nozzle of FIG. 1, including the photoresist processing operation of FIG. 3.

Referring to FIG. 5, the stabilizing nozzle 10 may become an integral part of a multi-station processing facility. For example, one or more stabilizing nozzles 10 can be attached to a conveyor belt 110 that moves in a direction 112. For multiple nozzles 10, they can be grouped on a tray (not shown) to facilitate their movement from one operation to the next. At a first operation 116, the device 12 is loaded onto the stabilizing nozzle 10. The belt 110 then moves the stabilizing nozzle 10 and device 12 to the photoresist operation 100, where the nozzles 102 are positioned around the stabilizing nozzle and photoresist is applied to the device.

Next, the belt 110 moves the stabilizing nozzle 10 and device 12 to a bake operation 120. The bake operation may include a thermal cover 122 to cover the entire stabilizing nozzle 10 and device 12. In addition, the fluid 20 (FIG. 1) flowing through the stabilizing nozzle 10 may be heated to facilitate the baking operation. After baking, the belt 110 moves the stabilizing nozzle 10 and device 12 to an unload operation 124. The unload operation removes the device 12 so that the stabilizing nozzle 10 may then be loaded with another device for processing.

It is understood that several modifications, changes and substitutions are intended in the foregoing disclosure and in some instances some features of the invention will be employed without a corresponding use of other features. For example, the expelled fluid through the nozzles 10 or 70 may be a processing fluid, contain constituents, or may be used to clean the device 12. Accordingly, it is appropriate that the appended claims be construed broadly and in a manner consistent with the scope of the invention.

What is claimed is:

1. A method for applying a material to a device, the method comprising:

directing a first flow of fluid along a first axis and against a bottom surface of the device to suspend the device;

directing a plurality of second flows of fluid towards the first axis and around an outer circumference of the device to stabilize the device over the first flow;

injecting the material on the device while it is stabilized over the first flow.

2. The method of claim 1 wherein a velocity of the first flow of fluid is less than a velocity of any one of the second flows of fluid.

3. The method of claim 1 further comprising:

adjusting a force of the first flow of fluid to compensate for a force exerted by the injected material.

4. The method of claim 1, wherein the second flows of fluid form a concentric ring with the first flow of fluid.

5. The method of claim 4 wherein the second flows of fluids form a conical shape, concentric with the first flow of fluid.

6. The method of claim 1 further comprising:

moving the device while it is being suspended and stabilized to a station in which the material is to be injected.

7. The method of claim 6 wherein the step of moving incorporates a conveyor belt.

8. A method for locating a device in a predetermined point of a plane, the method comprising the steps of:

receiving a first fluid from a first fluid source and discharging the first fluid towards the device so that the first fluid provides a first force to float the device along an axis, the axis intersecting the predetermined point and perpendicular with the plane, and receiving a second fluid from a second source and discharging the second fluid so that the second fluid provides a second force, different from the first force, to position the device in the plane.

9. The method of claim 8 wherein the first fluid is discharged along the axis and the second fluid is discharged towards the axis.

10. The method of claim 8 further comprising responding to an external signal for adjusting the force of the first fluid.

11. The method of claim 8 further comprising processing the device with the first fluid.

* * * * *